(12) United States Patent
Del Rosal et al.

(10) Patent No.: US 11,096,277 B2
(45) Date of Patent: Aug. 17, 2021

(54) PRINTED CIRCUIT BOARD SHIELDING AND POWER DISTRIBUTION VIA EDGE PLATING

(71) Applicant: International Business Machines Corporation, Armonk, NY (US)

(72) Inventors: Edni Del Rosal, Austin, TX (US); Anil Yuksel, Austin, TX (US); David Green, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/568,908

(22) Filed: Sep. 12, 2019

(65) Prior Publication Data

US 2021/0084756 A1 Mar. 18, 2021

(51) Int. Cl.
| | | |
|---|---|---|
| *H05K 1/02* | (2006.01) | |
| *H05K 1/11* | (2006.01) | |
| *H05K 1/18* | (2006.01) | |
| *H05K 3/02* | (2006.01) | |

(Continued)

(52) U.S. Cl.
CPC ......... *H05K 1/0298* (2013.01); *H05K 1/0218* (2013.01); *H05K 1/0231* (2013.01); *H05K 1/111* (2013.01); *H05K 1/115* (2013.01); *H05K 1/181* (2013.01); *H05K 3/02* (2013.01); *H05K 3/28* (2013.01); *H05K 3/40* (2013.01); *H05K 2201/0715* (2013.01);
(Continued)

(58) Field of Classification Search
CPC ...... H05K 1/0298; H05K 3/02; H05K 1/0231; H05K 3/40; H05K 3/28; H05K 1/115; H05K 1/0218; H05K 2201/10015; H05K 2201/09672; H05K 2203/0723; H05K 2201/0715
See application file for complete search history.

(56) References Cited

U.S. PATENT DOCUMENTS 5,376,759 A * 12/1994 Marx ................... H05K 1/0218
174/250
5,586,011 A * 12/1996 Alexander ........... H05K 1/0218
174/355
(Continued)

FOREIGN PATENT DOCUMENTS

| CN | 202323066 U | 7/2012 |
| CN | 1055922624 B | 11/2018 |

OTHER PUBLICATIONS

Cao, Ying S. et al., "PCB Edge Shielding Effectiveness Evaluation and Design Guidelines," 2018 IEEE Symposium on Electromagnetic Compatibility, Signal Integrity and Power Integrity (EMC, SI & PI), Jul. 2018.

(Continued)

*Primary Examiner* — Ishwarbhai B Patel
(74) *Attorney, Agent, or Firm* — Scott S. Dobson

(57) ABSTRACT

A circuit board and method of manufacture therefor utilize voltage domain edge plating disposed on at least a portion of one or more edges of a circuit board to electrically couple voltage domain conductive shapes disposed in different conductive layers of the circuit board. By doing so, interconnection of multiple voltage domain conductive shapes in different conductive layers may be facilitated with improved power integrity, while also providing EMI shielding along the edge of the circuit board.

13 Claims, 3 Drawing Sheets

(51) Int. Cl.
*H05K 3/40* (2006.01)
*H05K 3/28* (2006.01)

(52) U.S. Cl.
CPC .............. *H05K 2201/09672* (2013.01); *H05K 2201/10015* (2013.01); *H05K 2203/0723* (2013.01)

(56) References Cited

U.S. PATENT DOCUMENTS

| | | | |
|---|---|---|---|
| 7,326,858 B2* | 2/2008 | Lee | H05K 1/162 |
| | | | 174/260 |
| 9,111,915 B1 | 8/2015 | Sundstrom | |
| 9,433,090 B2* | 8/2016 | Atkinson | H05K 1/0218 |
| 9,673,179 B1* | 6/2017 | Huber | H01L 25/0657 |
| 2003/0213619 A1* | 11/2003 | Denzene | H05K 1/0243 |
| | | | 174/261 |
| 2015/0282317 A1* | 10/2015 | Gonya | H05K 3/403 |
| | | | 174/262 |
| 2017/0025775 A1 | 1/2017 | Jiang et al. | |
| 2018/0049311 A1 | 2/2018 | Hoang et al. | |

OTHER PUBLICATIONS

Bai, Siqi, et al., "An EMI Estimation for Shielding Edge Treatments on a Printed Circuit Board," 2016 IEEE International Symposium on Electromagnetic Compatibility (EMC), Jul. 2016.

Anonymously, "High-density edge connector with end face contacts," An IP.com Prior Art Database Technical Disclosure (IPCOM000238743D), Sep. 16, 2014.

\* cited by examiner

PRINTED CIRCUIT BOARD SHIELDING AND POWER DISTRIBUTION VIA EDGE PLATING

BACKGROUND

Printed circuit boards (PCBs) are generally used to support and interconnect multiple electrical components such as integrated circuits (ICs) and supporting passive and active electrical components. PCBs may be stand-alone boards, or may include edge connectors enabling the PCBs to be interconnected with other electrical components through interconnecting slots.

A PCB in general includes one or more sheets of insulating material supporting conductive material (typically copper) that forms the interconnections between electrical components mounted on the PCB. The insulating material used in a PCB may be rigid or flexible, and in many instances the conductive material is deposited as a sheet on a surface of the insulating material and then etched using a photolithographic process to define individual conductive traces.

As computing technology has continued to progress, PCB sizes continue to decrease while supporting greater numbers of electrical components and greater numbers of interconnects therebetween. Trace widths continue to decrease, thereby enabling greater numbers of interconnects within a given area, and multi-layer PCBs have been developed supporting multiple sheets of insulating material (each generally referred to as a dielectric layer) interleaved with multiple layers of conductive material (each generally referred to as a conductive layer) to form a multi-layer stack or substrate. In addition, through holes have been developed to support interconnections between different conductive layers in a multi-layer stack. Further, in some designs, different conductive layers may be dedicated to different tasks, e.g., to serve as a ground reference, to serve as one or more voltage domains, or to serve as interconnects for communicating data signals between electrical components.

Nonetheless, as PCBs continue to increase in capabilities, designing such PCBs to accommodate the power, ground and interconnect requirements of complex electrical components remains challenging. Routing power signals to different electrical components internal to a PCB, for example, may be difficult, and may necessitate the use of additional conductive layers or modifying existing power domains, potentially compromising the power integrity of those domains.

Further, electromagnetic interference (EMI) is a persistent concern for PCBs and various types of shielding have been utilized to minimize EMI. For example, it has been found that, particularly with higher frequency interconnects, current communicated between two conductive layers in a PCB can effectively create a slot antenna that radiates noise both within and outside of a chassis within which the PCB is mounted. In some PCB designs, fences formed by grounded vias running along the edges of a PCB at regular intervals are used to reduce EMI emissions and susceptibility, although the use of increasingly higher signal frequencies can require smaller via spacings that can be problematic to achieve. In other PCB designs, ground edge plating may be used to interconnect ground planes within a PCB with a conductive material electroplated onto the edges of the PCB. Edge plating in this manner generally is more effective at shielding EMI than fencing, but generally comes at a higher cost.

SUMMARY

In accordance with some embodiments, a circuit board may include a stack including a plurality of conductive layers separated from one another by a plurality of dielectric layers, the stack further including a plurality of edges defining at least a portion of a perimeter of the stack, a voltage domain including first and second voltage domain conductive shapes disposed on different conductive layers among the plurality of conductive layers, and edge plating disposed on at least a portion of one of the plurality of edges and electrically coupling the first and second voltage domain conductive shapes to one another.

In some embodiments, the edge plating is directly coupled to each of the first and second voltage domain conductive shapes. Also, in some embodiments, the edge plating is coupled to at least one of the first and second voltage domain conductive shapes through a conductive via extending through at least a portion of the stack. Further, in some embodiments, the edge plating is electroplated edge plating.

Some embodiments may further include at least one decoupling capacitor disposed on a top or bottom surface of the stack proximate one of the plurality of edges and electrically coupled between the edge plating and a ground reference. Some embodiments may also include a plurality of decoupling capacitors disposed at regular intervals on a top or bottom surface of the stack proximate one or more of the plurality of edges and electrically coupled between the edge plating and a ground reference.

In addition, in some embodiments, the edge plating is first edge plating disposed on a first portion of a first edge among the plurality of edges, and the circuit board further includes second edge plating disposed on a second portion of the first edge. Some embodiments may also include a ground reference including first and second ground conductive shapes disposed on different conductive layers among the plurality of conductive layers, and the second edge plating electrically couples the first and second ground conductive shapes to one another. In some embodiments, the voltage domain is a first voltage domain, the circuit board further includes a second voltage domain including third and fourth voltage domain conductive shapes disposed on different conductive layers among the plurality of conductive layers, and the second edge plating electrically couples the third and fourth voltage domain conductive shapes to one another. In addition, in some embodiments, the first and second edge plating are disposed at different lateral positions along the first edge. Moreover, in some embodiments, the first edge has a thickness, and the first edge plating spans only a first portion of the thickness of the first edge at least at a first lateral position along the first edge. In some embodiments, the second edge plating spans a second portion of the thickness of the first edge at least at the first lateral position along the first edge.

Moreover, in some embodiments, the first and second edge plating are formed by etching conductive material electroplated onto the first edge. Some embodiments may also include a protective insulating coating overlying the edge plating.

In accordance with other embodiments, a method of manufacturing a circuit board may include forming a stack including a plurality of conductive layers separated from one another by a plurality of dielectric layers, the stack further including a plurality of edges defining at least a portion of a perimeter of the stack and a voltage domain including first and second voltage domain conductive shapes disposed on different conductive layers among the plurality of conductive layers, and forming edge plating on at least a portion of one of the plurality of edges to electrically couple the first and second voltage domain conductive shapes to one another.

In some embodiments, forming the edge plating includes electroplating conductive material on the one of the plurality of edges after forming the stack. In addition, in some embodiments, the edge plating is first edge plating disposed on a first portion of a first edge among the plurality of edges, and the circuit board further includes second edge plating disposed on a second portion of the first edge and formed of the electroplated conductive material, the method further including etching the electroplated conductive material to separate the first and second edge plating.

Some embodiments may also include electrically coupling at least one decoupling capacitor between the edge plating and a ground reference proximate one or more of the plurality of edges. Some embodiments may further include electrically coupling a plurality of decoupling capacitors between the edge plating and a ground reference at regular intervals on a top or bottom surface of the stack proximate one or more of the plurality of edges. In addition, some embodiments may further include applying a protective insulating coating over the edge plating.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 1:
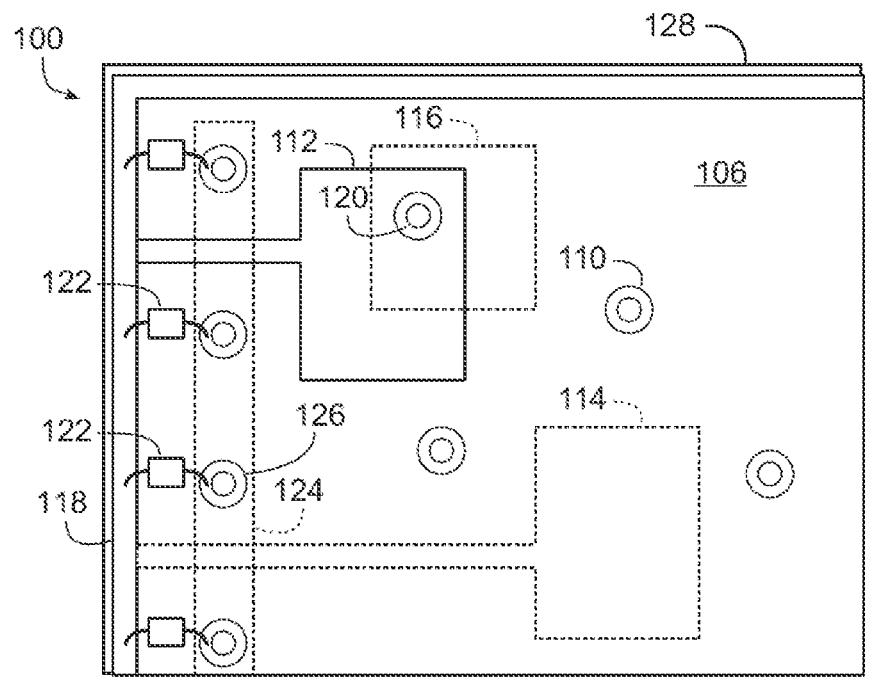
FIG. 1 is a top plan view of a portion of one example implementation of a printed circuit board consistent with the invention.

Printed circuit board (PCB) designs continue to increase in complexity, and as a result may incorporate multiple voltage domains with only a limited number of layers to route such domains, and may be susceptible to EMI emissions to and from signal traces in such designs. A voltage domain, in this regard, refers to a power distribution network on a PCB that provides a particular voltage level usable by chips and other electrical components on the chip, and that can in some instances be selectively switched on or off to reduce energy consumption by the components powered by the voltage domain during periods of inactivity. As such, while some PCBs may only support a single voltage domain, other PCBs may support multiple voltage domains, with each being separately controllable and/or providing a particular voltage level (e.g., 5V, 1.2V, 0.8V, etc.). In some instances, voltage domains may be specifically designed for power integrity to ensure that a steady voltage and current is provided to the components powered by the voltage domain.

Conventional approaches to EMI shielding have utilized ground fencing consisting of regularly spaced vias along the edges of a PCB and tied to a ground reference; however, the shielding effectiveness of a fence is a function of both frequency and via spacing, and as bus speeds increase the spacing of the vias is largely limited by manufacturing concerns. Ground edge plating, where the edges of a PCB are plated with conductive material and electrically coupled to a ground reference, may alternatively be used to provide EMI shielding along the edge of a PCB, and generally without the frequency limitations associated with fencing. However, ground edge plating can also introduce additional challenges to PCB designers as it constrains the ability to connect voltage domains.

In various embodiments consistent with the invention, and as will become more apparent below, a technique referred to herein as voltage domain edge plating may instead be used to provide both EMI shielding and to facilitate voltage domain design. Voltage domain edge plating consistent with the invention is generally disposed on at least a portion of one or more edges of a circuit board and is used to electrically couple voltage domain conductive shapes disposed in different conductive layers of the circuit board. A voltage domain conductive shape, in this regard, may generally refer to any geometry of conductive material disposed in a conductive layer of a PCB and electrically coupled to a voltage domain. As such, a voltage domain conductive shape can take a number of forms including one or more traces, pads, or any other geometry through which a power signal may be conducted.

By doing so, interconnection of multiple voltage domain conductive shapes in different conductive layers may be facilitated with improved power integrity, while also providing EMI shielding along the edge of the circuit board. Voltage domain edge plating or other suitable manufacturing techniques for applying a conductive material to a PCB edge, in particular, may be used to route a voltage domain to a section of a printed circuit board (PCB) that may otherwise be difficult or inaccessible to route to.

Figure 2:
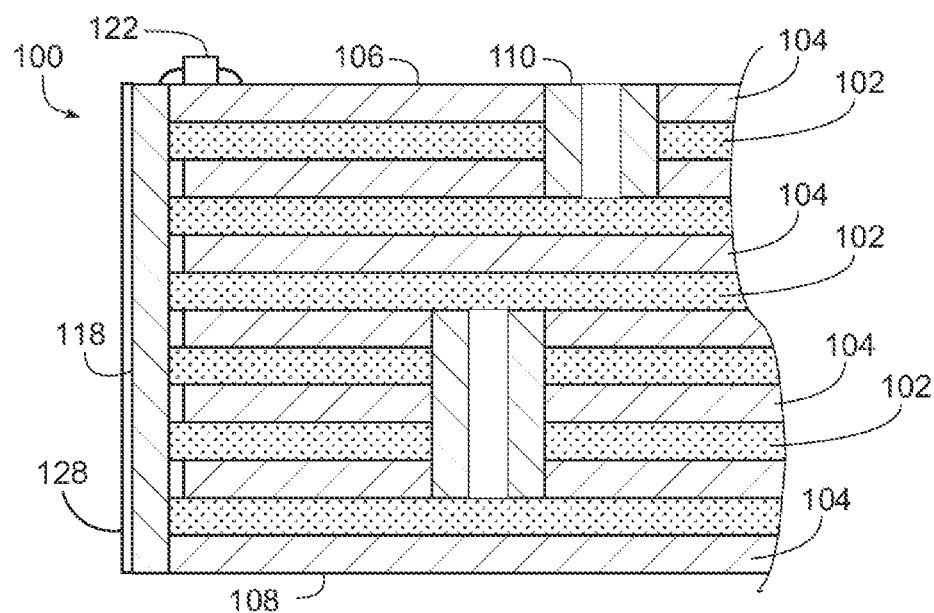
FIG. 2 is a functional cross-sectional view taken through the printed circuit board of FIG. 1.

FIGS. 1-2, for example, illustrate an example PCB 100 incorporating voltage domain edge plating consistent with some embodiments of the invention. PCB 100 includes a stack or substrate formed of alternating dielectric layers 102 and conductive layers 104. Each dielectric layer 102 may be formed of a rigid or solid dielectric material, e.g., various composite materials, while each conductive layer 104 may be formed of copper or another metal or conductive material, and PCB 100 may be rigid or flexible in different embodiments and/or may include edge connectors for interconnecting the PCB with other electrical components. A multitude of different materials and manufacturing techniques may be used to construct the stack of dielectric and conductive layers, as will be appreciated by those of ordinary skill having the benefit of the instant disclosure.

PCB 100 includes top and bottom surfaces 106, 108, and in some instances may include one or more through holes or vias 110 creating interconnections between different conductive layers. Some vias may extend through the complete thickness of PCB 100, while other vias may only extend between a subset of layers. Each conductive layer will generally be etched and patterned to define a number of conductive shapes, including traces, pads, heat sinks, etc., and such etching and patterning may be performed in various manners that will be appreciated by those of ordinary skill having the benefit of the instant disclosure. FIG.

1, for example, illustrates a number of representative shapes 112, 114 and 116, with shape 112 being defined on a top conductive layer 104 on top surface 106, and with shapes 114 and 116 being disposed further down in the stack, e.g., in an intermediate conductive layer 104, or in the case of shape 114, on a bottom conductive layer disposed on bottom surface 108 of PCB 100. In some embodiments, one or more conductive layers may be dedicated as a power, ground or interconnect layer such that only power, ground or interconnect signals are utilized in that layer, however, in other embodiments all layers may be utilized for multiple purposes.

It will be appreciated that FIGS. 1 and 2 are not intended to depict an actual PCB to scale, and as such, placement and sizing of features such as vias 110 and shapes 112, 114 and 116, as well as relative thickness of conductive and dielectric layers, are not illustrated in these figures. Moreover, it will be appreciated that the illustration of conductive layers as solid layers in FIG. 2 is merely for the purpose of simplifying the illustration, as each conductive layer 104 will generally be patterned to define various shapes, e.g., traces and pads, for routing ground, power and data signals between components coupled to the PCB.

In the illustrated embodiment, voltage domain edge plating 118 is disposed on one or more edges of PCB 100, and may be used, for example, to electrically couple together multiple conductive shapes for a particular voltage domain, e.g., to connect shape 112 and shape 114 respectively disposed on top and bottom surfaces 106, 108 of PCB 100. A portion of voltage domain edge plating 118 may extend over the top and bottom surfaces of PCB 100 in some designs, and as illustrated in FIG. 2, only the top and bottom conductive layers 104 are directly electrically coupled to voltage domain edge plating 118. In other embodiments, however, voltage domain edge plating 118 may also be directly coupled to one or more intermediate conductive layers. Where no direct coupling is supported, voltage domain conductive shapes in intermediate conductive layers (e.g., as illustrated by shape 116) may be electrically coupled to a voltage domain using vias (e.g., via 120).

Also in the illustrated embodiment, one or more decoupling capacitors, e.g., decoupling capacitors 122, may be used in connection with providing edge EMI shielding through voltage domain edge plating 118. Each decoupling capacitor 122 is electrically coupled to the voltage domain as well as to a ground reference, e.g., a ground reference shape 124 disposed in a lower conductive layer electrically coupled to each decoupling capacitor through an associated via 126. Doing so may improve the power integrity and shielding effectiveness of the voltage domain edge plating, and in some embodiments decoupling capacitors may be placed at a designer defined interval along the edge(s) of the PCB. The value of each capacitor may be selected to minimize ripple on the voltage domain. Additionally, these capacitors may also provide a low impedance return current path for high frequency currents, thereby further improving shielding effectiveness. It may be desirable in some embodiments to place decoupling capacitor pads close to power domain and ground vias to maximize return current effect.

A protective insulating coating or layer 128 may also be added to the top of the voltage domain edge plating to insulate the voltage domain from the chassis or surrounding components/wiring. Various materials known to those of ordinary skill having the benefit of the instant disclosure may be used in different embodiments.

In addition, while PCB 100 of FIGS. 1-2 utilizes a single voltage domain edge plating 118, in other embodiments, multiple edge platings may be used to interconnect additional voltage domains and/or to provide ground shielding. The locations of such different edge platings may be selected in some embodiments based upon design requirements, e.g., to provide ground edge plating near high speed buses or other high frequency data signals where EMI interference is greatest and provide voltage domain edge plating based upon power routing requirements, while still enabling sufficient EMI shielding in other, less problematic areas (e.g., areas with lower frequency data signals). It will be appreciated that photoresistive or other photolithography techniques may be used to separate different edge platings in the event that electroplating is used to form a solid edge plating along the entire length of a PCB.

Figure 3:
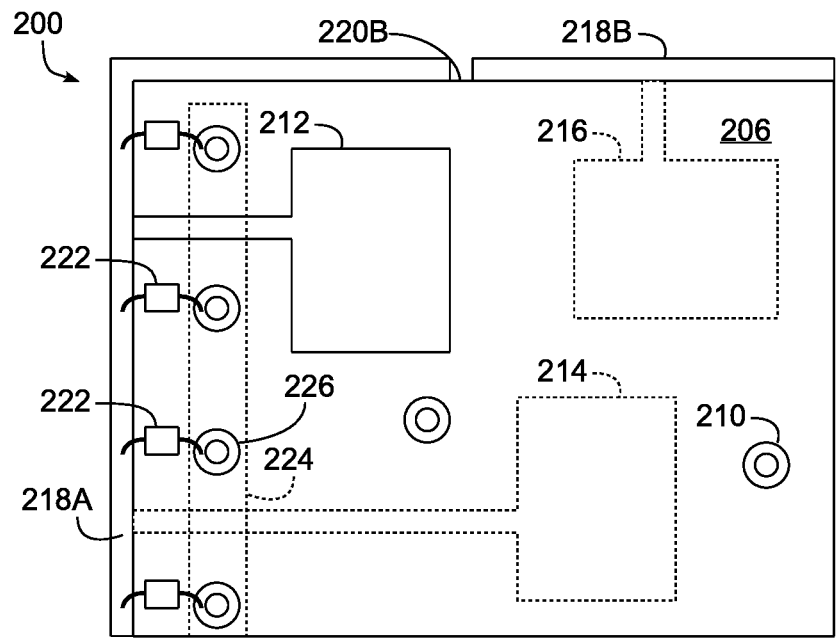
FIG. 3 is a top plan view of a portion of another example implementation of a printed circuit board consistent with the invention.
Figure 4:
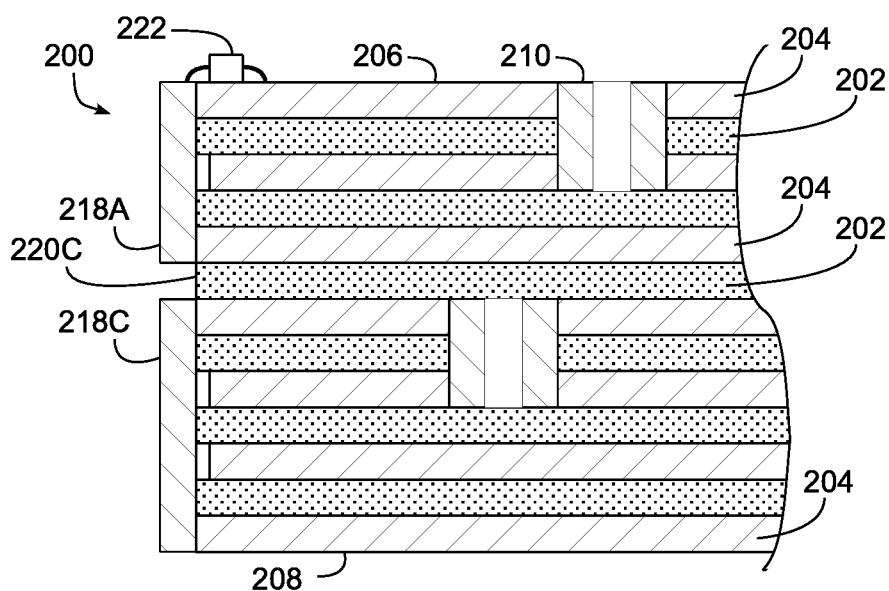
FIG. 4 is a functional cross-sectional view taken through the printed circuit board of FIG. 3.

FIGS. 3-4, for example, illustrate another example PCB 200 incorporating a stack of dielectric and conductive layers 202, 204, a top surface 206, a bottom surface 208, conductive vias 210, and various conductive shapes 212, 214, 216. In lieu of a single voltage domain edge plating, however, three different edge plating 218A, 218B, and 218C may be utilized on different portions of one or more edges of the PCB. Edge plating 218A, for example, may be used as a first voltage domain edge plating used to electrical couple together conductive shapes associated with a first voltage domain, while edge plating 218B may be used as a second voltage domain edge plating used to electrical couple together conductive shapes associated with a second, different voltage domain, and edge plating 218C may be used as a ground edge plating to electrical couple together conductive shapes associated with a ground reference.

FIGS. 3-4 also illustrate how different edge plating may be arranged relative to other edge plating in some embodiments. Edge plating 218A and edge plating 218B, for example, illustrate edge plating disposed at different lateral positions along an first edge and separated by a gap 220B (FIG. 3). Edge plating 218A and edge plating 218C, on the other hand, illustrate edge plating that spans different portions of the thickness of the edge of the PCB, such that at one or more lateral positions of the edge, two or more edge plating span the thickness. Edge plating 218A and 218C are separated by a gap 220C, and are thus electrically isolated from one another. As with PCB 100, PCB 200 may also include decoupling capacitors 222 electrically coupled between a voltage domain edge plating (e.g., edge plating 218A) and a ground reference 224 through conductive vias 226.

Figure 5:
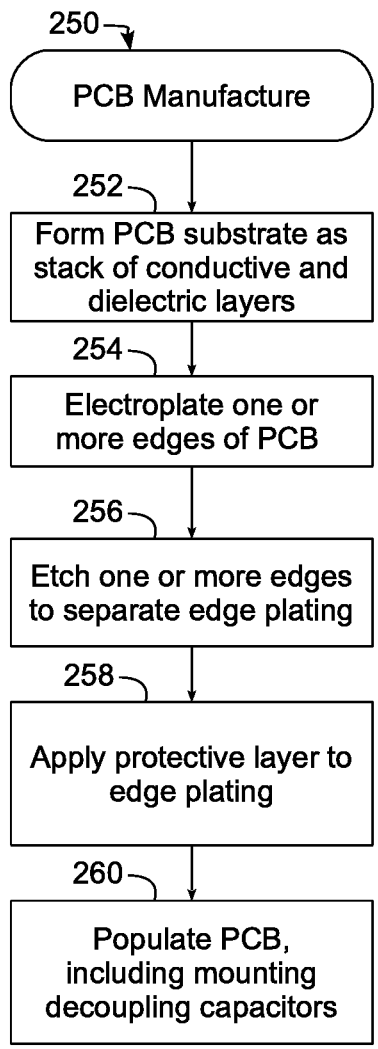
FIG. 5 is a flowchart illustrating an example sequence of operations for manufacturing a printed circuit board in a manner consistent with the invention.

FIG. 5 illustrates an example sequence of operations 250 for manufacturing a PCB consistent with some embodiments of the invention. First, in block 252, a PCB stack or substrate is formed with multiple conductive and dielectric layers, with the conductive layers patterned based upon design requirements, and in some instances with conductive vias formed in the substrate to interconnect different conductive layers. Block 252 may be implemented using various combinations of PCB manufacturing technologies and materials, as will be appreciated by those of ordinary skill having the benefit of the instant disclosure.

Next, in block 254 one or more edges of the PCB is electroplated to form edge plating, using various electroplating techniques understood by those of ordinary skill having the benefit of the instant disclosure, and in some embodiments, block 256 may then be performed to etch one or more of the edges to separate edge plating for different voltage domains and/or to separate ground edge plating, again using various etching techniques understood by those of ordinary skill having the benefit of the instant disclosure. In other embodiments, however, the formation of edge plating may be performed using other techniques, e.g., using a conductive ink based solution.

Next, in block 258, a protective insulating layer may optionally be applied to the edge plating to insulate the edge plating and reduce the risk of shorting out the PCB along the edge. Then, in block 260, the PCB may be populated with electrical components, e.g., chips, active devices, passive devices, etc. In addition, at this time one or more decoupling capacitors may be mounted to the board to electrically couple between the edge plating and a ground reference. Various component population techniques, e.g., surface mount techniques, soldering, automated placement, etc., may be used as will be appreciated by those of ordinary skill having the benefit of the instant disclosure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit board, comprising:
    a stack including a plurality of conductive layers separated from one another by a plurality of dielectric layers, the stack further including a plurality of edges defining at least a portion of a perimeter of the stack;
    a voltage domain including first and second voltage domain conductive shapes disposed on different conductive layers among the plurality of conductive layers;
    edge plating disposed on at least a portion of one of the plurality of edges and electrically coupling the first and second voltage domain conductive shapes to one another; and
    at least one decoupling capacitor disposed on a top or bottom surface of the stack proximate one or more of the plurality of edges and electrically coupled between the edge plating and a ground reference through an associated via, the ground reference disposed in a conductive layer of the plurality of conductive layers.

2. The circuit board of claim 1, wherein the edge plating is directly coupled to each of the first and second voltage domain conductive shapes.

3. The circuit board of claim 1, wherein the edge plating is coupled to at least one of the first and second voltage domain conductive shapes through a conductive via extending through at least a portion of the stack.

4. The circuit board of claim 1, wherein the edge plating is electroplated edge plating.

5. The circuit board of claim 1, wherein the at least one decoupling capacitor includes a plurality of decoupling capacitors disposed at regular intervals.

6. The circuit board of claim 1, wherein the edge plating is first edge plating disposed on a first portion of a first edge among the plurality of edges, and wherein the circuit board further comprises second edge plating disposed on a second portion of the first edge.

7. The circuit board of claim 6, further comprising a ground reference including first and second ground conductive shapes disposed on different conductive layers among the plurality of conductive layers, wherein the second edge plating electrically couples the first and second ground conductive shapes to one another.

8. The circuit board of claim 6, wherein the voltage domain is a first voltage domain, wherein the circuit board further comprises a second voltage domain including third and fourth voltage domain conductive shapes disposed on different conductive layers among the plurality of conductive layers, wherein the second edge plating electrically couples the third and fourth voltage domain conductive shapes to one another.

9. The circuit board of claim 6, wherein the first and second edge plating are disposed at different lateral positions along the first edge.

10. The circuit board of claim 6, wherein the first edge has a thickness, and wherein the first edge plating spans only a first portion of the thickness of the first edge at least at a first lateral position along the first edge.

11. The circuit board of claim 10, wherein the second edge plating spans a second portion of the thickness of the first edge at least at the first lateral position along the first edge.

12. The circuit board of claim 6, wherein the first and second edge plating are formed by etching conductive material electroplated onto the first edge.

13. The circuit board of claim 1, further comprising a protective insulating coating overlying the edge plating.

* * * * *